United States Patent [19]
Abe et al.

[11] 4,333,226
[45] Jun. 8, 1982

[54] METHOD OF FORMING PATTERNED REFRACTORY METAL FILMS BY SELECTIVE OXYGEN IMPLANT AND SUBLIMATION

[75] Inventors: Haruhiko Abe, Takarazuka; Masao Nagatomo, Itami; Natsuro Tsubouchi; Hiroshi Harada, both of Kawanishi; Junichi Mitsuhashi, Sakai, all of Japan

[73] Assignee: Mitsubishi Denki Kabushiki Kaisha, Japan

[21] Appl. No.: 209,889

[22] Filed: Nov. 24, 1980

[30] Foreign Application Priority Data

Nov. 30, 1979 [JP] Japan ................ 54/156504

[51] Int. Cl.³ .................... B05D 3/06; B05D 5/12; H01L 21/312
[52] U.S. Cl. .................... 29/576 B; 148/1.5; 156/628; 357/65; 427/38
[58] Field of Search .......... 156/628; 148/1.5; 29/576 B; 427/38, 126.3; 357/65

[56] References Cited

U.S. PATENT DOCUMENTS

| | | | |
|---|---|---|---|
| 3,622,410 | 11/1971 | Carlson | 156/628 |
| 4,093,503 | 6/1978 | Harris et al. | 156/628 |
| 4,108,715 | 8/1978 | Ishikawa et al. | 156/628 |
| 4,285,761 | 8/1981 | Fatula, Jr. et al. | 156/628 |

FOREIGN PATENT DOCUMENTS

49-122669 11/1974 Japan .
54-30780 3/1979 Japan .

OTHER PUBLICATIONS

Ballantyne et al., Jour. Vac. Science & Tech. 10 (1973) 1094.

*Primary Examiner*—Upendra Roy
*Attorney, Agent, or Firm*—Robert E. Burns; Emmanuel J. Lobato; Bruce L. Adams

[57] ABSTRACT

A thin film of a metal which is capable of oxidation and sublimation is formed on a major surface of a semiconductor substrate, and a portion of a major surface of the thin metallic film is irradiated with an oxygen ion beam to convert a portion of the thin metallic film to an oxide, and subsequently the thin metallic film is heat treated to remove the oxide by sublimation, whereby electrodes or wiring for a semiconductor integrated circuit are formed by the remaining thin metallic film.

15 Claims, 12 Drawing Figures

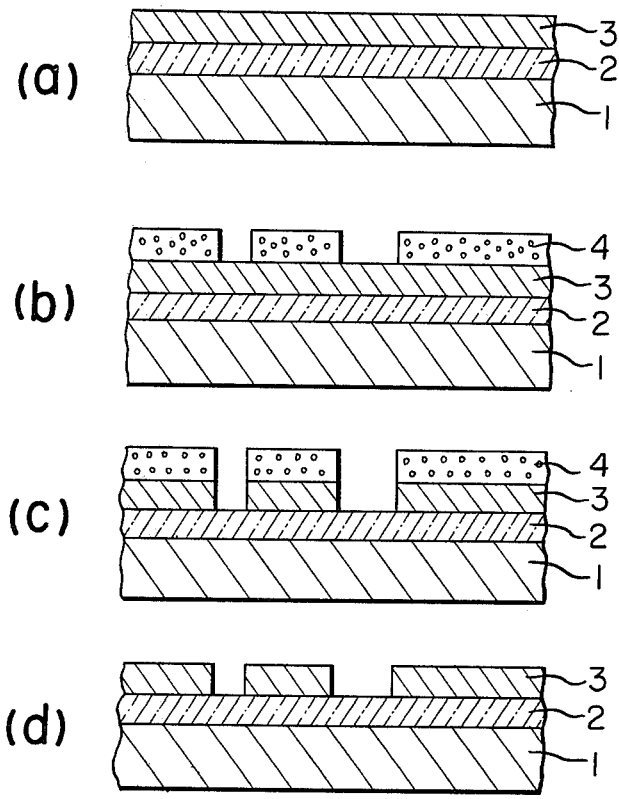
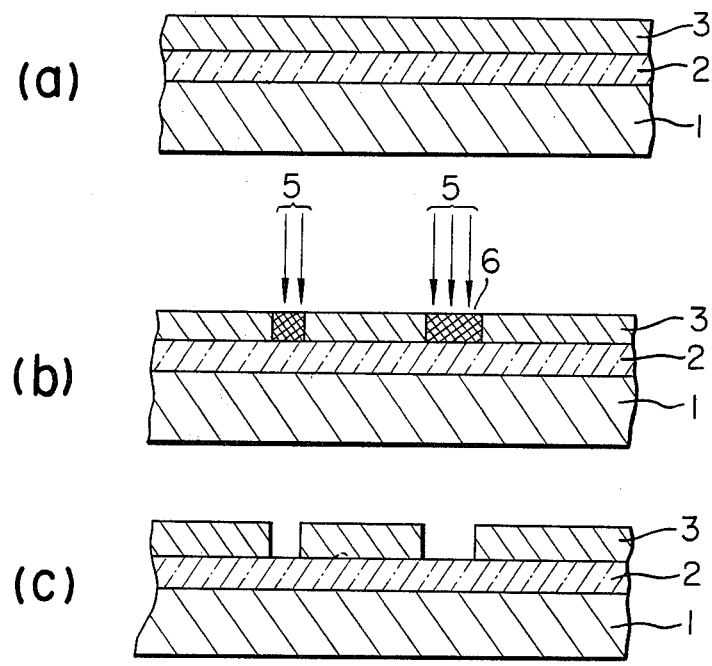

FIG. 2
(a) 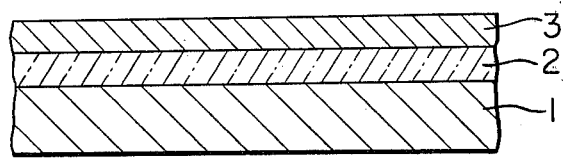
(b) 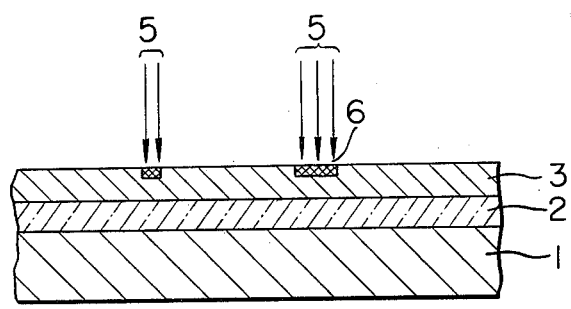
(c) 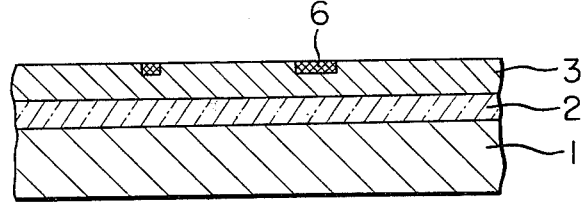
(d) 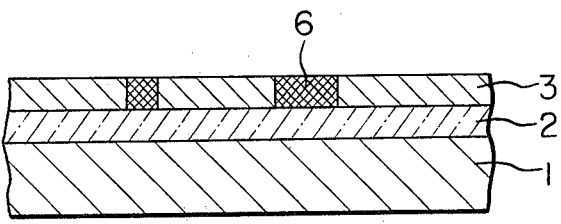
(e) 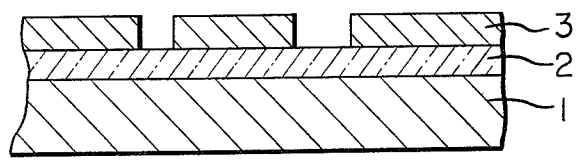

METHOD OF FORMING PATTERNED REFRACTORY METAL FILMS BY SELECTIVE OXYGEN IMPLANT AND SUBLIMATION

BACKGROUND OF THE INVENTION

1. Field of the Invention

This invention relates to a method of manufacturing semiconductor devices, and particularly to a method of manufacturing the electrodes and wiring in a semiconductor integrated circuit.

2. Description of the Prior Art

Heretofore aluminum and polyclystalline silicon have been the most widely used of materials for the electrodes and wiring in semiconductor integrated circuits, but with the use of aluminum miniaturization has been difficult, and with the use of polycrystalline silicon resistance values are high and it has not been possible to give the elements high speed characteristics. For these reasons, metals with a high melting point, such as molybdenum and tungsten or metallic silicides of these ($MoSi_2$, $WSi_2$) have recently been studied as materials to replace polycrystalline silicon, and in order to obtain a certain pattern of electrodes and wiring with these, a photoengraving process has been applied.

FIGS. 1(a) to 1(d) show the prior manufacturing process of the wiring portion. In this prior art process, firstly, as shown in FIG. 1(a), a silicon oxide film 2 and a molybdenum film 3 are sequentially formed on a silicon semiconductor substrate 1, and then a resist 4 is formed in a predetermined pattern by means of a photo-engraving technique, as shown in FIG. 1(b). Subsequently, with this resist 4 as a mask, the aforementioned molybdenum film 3 is selectively etched, as shown in FIG. 1(c), after which the resist 4 is removed and a desired wiring pattern in the molybdenum film 3 is obtained, as seen in FIG. 1(d).

However, the above described method employs a resist 4 and so necessitates the process of selectively etching the resist 4, and the process of completely removing it, which results in the drawback that the manufacturing process is complicated.

SUMMARY OF THE INVENTION

It is an object of the present invention to provide a method for obtaining an electrode or wiring pattern from a high melting point metal such as molybdenum or tungsten, etc., without using a resist based method of photoengraving.

It is another object of the present invention to provide a method for obtaining an electrode or wiring pattern, which is reduced in the number of steps required and is not complicated.

It is still another object of the present invention to provide an electrode or wiring pattern for a semiconductor integrated circuit wherein the pattern can be miniaturized with accuracy.

It is a further object of the present invention to provide an electrode or wiring pattern for a semiconductor integrated circuit which has a low impedance value enabling the elements to be made high speed.

The present invention accomplishes these objects by forming a thin metallic film which is capable of oxidation and sublimation, on a major surface of a semiconductor substrate, and irradiating an oxygen ion beam onto a portion of a major surface of the thin metallic film, changing the irradiated portion of the thin metallic film to an oxide, and subsequently heat treating the thin metallic film to remove the oxide portion by sublimation, whereby electrodes or wiring for a semiconductor device are formed by the remaining thin metallic film.

According to the present invention it is possible to manufacture electrodes and wiring in a miniaturized pattern and with low resistance, by a simple process.

BRIEF DESCRIPTION OF THE DRAWINGS

The present invention will become more readily apparent from the following detailed description taken in conjunction with the accompanying drawings in which:

FIGS. 1(a) to 1(d) are partial sectional views showing the sequence of steps for forming the electrodes or wiring for a semiconductor integrated circuit by a photo-engraving process according to the prior art;

FIGS. 2(a) to 2(e) are partial sectional views showing the sequence of steps for forming the electrodes or wiring for a semiconductor integrated circuit, according to one embodiment of the method of the present invention; and FIGS. 3(a) to 3(c) are fragmental sectional views showing another embodiment of the present invention.

DESCRIPTION OF THE PREFERRED EMBODIMENTS

Referring now to the drawings, and FIGS. 2(a) to 2(e) in particular, there is illustrated the sequence of steps for forming the electrodes or wiring for a semiconductor integrated circuit, according to one embodiment of the method of the present invention.

In this embodiment as shown in FIG. 2(a), a silicon oxide film 2 and a molybdenum film 3 are sequentially formed on a major surface of a silicon semiconductor substrate 1 which forms a predetermined element. Subsequently, as shown in FIG. 2(b), an oxygen (O or $O_2$) ion beam 5 is irradiated against a surface of the molybdenum film 3, and the molybdenum of the irradiated portions is converted to a molybdenum oxide ($MoO_2$ or $MoO_3$) 6. The oxygen ion beam 5 is scanned in accordance with a predetermined pattern so as to implant oxygen ions to selectively form a molybdenum oxide 6 to a depth in the surface region only in an area negatively corresponding to but smaller by a predetermined amount than the required pattern, as shown in FIG. 2(c). Next, this is heated to a high temperature of 500° C. or higher in an atmosphere of an inert gas such as $N_2$ or Ar to cause the aforementioned oxide 6 to spread by oxidation to reach the silicon oxide film 2, as in FIG. 2(d). Since this oxidation will occur in all directions at a substantially equal speed in the area in the molybdenum around the ion implanted molybdenum oxide regions, the area of implantation should be deliberately made smaller than the final desired wiring pattern so that subsequent spreading of the molybdenum oxide under the application of heat will cause the final pattern of oxidation to match a negative or complementary pattern of the required wiring pattern. Thus, the amount by which the pattern of the irradiated are a is made smaller than the final desired pattern of the molybdenum film is mainly dependent upon the oxidation rate of the molybdenum film.

However, the molybdenum oxide 6 has the characteristic of sublimation at 500° C. or higher, so that the temperature to which it is subjected in the interests of advancing the oxidation also causes the oxidized portions to sublimate and be removed. Thus the oxidized area in the predetermined irradiated pattern is removed by sublimation, leaving a molybdenum film 3 arranged in a desired wiring pattern as shown in FIG. 2(e), without further steps.

In the above described embodiment the depth of penetration of the oxygen ion beam was restricted to the surface layer region, although irradiation implantation may also be caused to have a greater depth including a depth sufficient to reach the substrate layer. In this case, as shown in FIG. 3(a), a silicon oxide film 2 and a molybdenum film 3 are sequentially formed on a major surface of a silicon semiconductor substrate 1 which forms a predetermined element. Subsequently, as shown in FIG. 3(b) an oxygen (O or $O_2$) ion beam 5 is irradiated, at energy higher than that in the first embodiment, against a surface of the molybdenum film 3 until the whole depth of the molybdenum in the irradiated area down to the substrate layer has been ion implanted, to convert the molybdenum in the irradiated area to a molybdenum oxide ($MoO_2$ or $MoO_3$) 6. As in the embodiment illustrated in FIGS. 2(a) to 2(e), the oxygen beam 5 may be scanned in accordance with a predetermined pattern which is smaller than the negative pattern of the desired wiring pattern as previously explained. Next this is heated to a high temperature of 500° C. or higher in an atmosphere of an inert gas such as $N_2$ or Ar, whereby the aforementioned oxide sublimates to leave a desired wiring pattern as shown in FIG. 3(c), without further steps.

As apparent from the above description, the oxygen ion may be implanted only in the surface region of the molybdenum film, or down to the substrate layer, in as much as sublimation of the molybdenum oxide is carried out at a high temperature of 500° C. or higher, and in a vacuum or in a high pressure of the aforementioned inert gases. Also, apart from the aforementioned molybdenum, tungsten, etc., too, may be used as the high melting point metal, and the method may, of course, be applied not just to the aforementioned wiring, but also, for example, to the forming of the gate electrodes of an MOSLSI, and so on.

The following Table indicates examples of the conditions for forming a wiring pattern with an $MO_2$ film of 5,000 Å thickness in accordance with the first embodiment of the present invention shown in FIGS. 2(a) to 2(e) and the second embodiment shown in FIGS. 3(a) to 3(c):

|  | Embodiment I | Embodiment II |
| --- | --- | --- |
| $MO_2$ Film Thickness | 5,000Å | 5,000Å |
| Ion Implantation Depth | 500Å | 5,000Å |
| Ion Dosage | $1 \times 10^{16}$ions/cm$^2$ | $5 \times 10^{14}$ions/cm$^2$ |
| Ion Implantation Energy | 50 keV | 600 keV |
| Oxidation Temperature | 700° C. | 700° C. |
| Oxidation Time | 30 min. | 30 min. |

As stated in detail hereinabove, according to the present invention electrodes or wiring for a semiconductor integrated circuit are obtained by selectively implanting an oxygen ion beam into a thin film of a metal which is capable of oxidation and sublimation at a high temperature, and removing by sublimation the implanted regions, and so electrodes or wiring for semiconductor integrated circuits can be formed extremely easily and with miniaturized patterns, without necessitating the complex process entailing photoengraving, of the prior art.

What is claimed is:

1. A method for the manufacture of semiconductor devices comprising the steps of;
    forming a thin metallic film of a metal which is capable of oxidation into an oxide that can be sublimated at a high temperature, on a major surface of a semiconductor substrate;
    irradiating an oxygen ion beam on a major surface of said thin metallic film in a predetermined pattern to implant the oxygen ions therein and to change the metal in the implanted portion to the oxide, said predetermined pattern corresponding to a negative of a desired pattern into which said thin metallic film is to be formed; and
    heating said thin metallic film to an elevated temperature effective to remove by sublimation the oxidized portions to form the desired pattern with the remaining thin metallic film.

2. A method for the manufacture of semiconductor devices as claimed in claim 1, wherein said thin metallic film to be irradiation implanted is a metal selected from a group consisting of molybdenum, tungsten and their silicides.

3. A method for the manufacture of semiconductor devices as claimed in claim 1, wherein said predetermined pattern is formed by scanning with said oxygen ion beam.

4. A method for the manufacture of semiconductor devices as claimed in claim 2, wherein said predetermined pattern is formed by scanning with said oxygen ion beam.

5. A method for the manufacture of semiconductor devices as claimed in any one of the preceeding claims, wherein said heat treatment is carried out at a temperature equal to or higher than 500° C., preferably at 700° C.

6. A method for the manufacture of semiconductor devices as claimed in any one of claims 1 to 4, wherein a silicon oxide film is formed between the semiconductor substrate and the thin metallic film.

7. A method for the manufacture of semiconductor devices as claimed in claim 5, wherein a silicon oxide film is formed between the semiconductor substrate and the thin metallic film.

8. A method for the manufacture of semiconductor devices as claimed in any one of claims 1 to 4, wherein the depth to which said oxygen ion beam is implanted is confined to the surface layer of the thin metallic film, and said predetermined pattern of the oxide is smaller than the negative of said desired pattern of the metallic film.

9. A method for the manufacture of semiconductor devices as claimed in claim 5, wherein the depth to which said oxygen ion beam is implanted is confined to the surface layer of the thin metallic film, and said predetermined pattern of the oxide is smaller than the negative of said desired pattern of the metallic film.

10. A method for the manufacture or semiconductor devices as claimed in claim 6 wherein the depth to which said oxygen ion beam is implanted is confined to the surface layer of the thin metallic film, and said predetermined pattern of the oxide is smaller than the negative of said desired pattern of the metallic film.

11. A method for the manufacture of semiconductor devices as claimed in claim 7 wherein the depth to which said oxygen ion beam is implanted is confined to the surface layer of the thin metallic film, and said predetermined pattern of the oxide is smaller than the negative of said desired metallic film.

12. A method for the manufacture of semiconductor devices as claimed in any one of claims 1 to 4, wherein the depth to which said oxygen ion beam is implanted extends to the substrate layer of the thin metallic film.

13. A method for the manufacture of semiconductor devices as claimed in claim 5, wherein the depth to which said oxygen ion beam is implanted extends to the substrate layer of the thin metallic film.

14. A method for the manufacture of semiconductor devices as claimed in claim 6, wherein the depth to which said oxygen ion beam is implanted extends to the substrate layer of the thin metallic film.

15. A method for the manufacture of semiconductor devices as claimed in claim 7, wherein the depth to which said oxygen ion beam is implanted extends to the substrate layer of the thin metallic film.

* * * * *